United States Patent [19]

Shimizu et al.

[11] 4,421,841
[45] Dec. 20, 1983

[54] PHOTOSENSITIVE LITHOGRAPHIC PLATE WITH SULFONATE CONTAINING PHOTOSENSITIVE POLYESTER

[75] Inventors: Shigeki Shimizu, Atsugi; Akinobu Oshima, Tokyo, both of Japan

[73] Assignee: Mitsubishi Chemical Industries Limited, Tokyo, Japan

[21] Appl. No.: 398,442

[22] Filed: Jul. 14, 1982

[30] Foreign Application Priority Data

Jul. 28, 1981 [JP] Japan .................. 56-118345
Apr. 5, 1982 [JP] Japan .................. 57-56183

[51] Int. Cl.$^3$ ............... G03C 1/68; C08G 18/00; C08G 63/00; C08G 69/00
[52] U.S. Cl. ............... 430/285; 204/159.19; 528/293; 528/295; 430/302
[58] Field of Search ............... 430/285; 204/159.19; 528/293, 294, 295

[56] References Cited

U.S. PATENT DOCUMENTS 3,622,320 11/1971 Allen ............... 430/285
3,926,642 12/1975 Breslow et al. ............... 430/285
4,073,777 2/1978 O'Neill et al. ............... 204/159.19
4,258,124 3/1981 Shimizu et al. ............... 430/285

Primary Examiner—Richard L. Schilling
Attorney, Agent, or Firm—Oblon, Fisher, Spivak, McClelland & Maier

[57] ABSTRACT

A photosensitive lithographic plate having, on a substrate, a photosensitive layer comprising a photosensitive polyester containing at least (A):

(a) an aromatic dicarboxylic acid unit represented by the general formula:

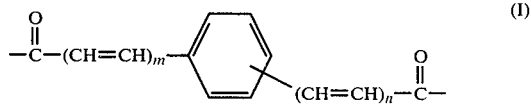

where m and n each represents an integer of 0 or 1, with at least one of them being 1, (b) a dicarboxylic acid unit having a sulfonate group, and (c) a diol unit represented by the general formula:

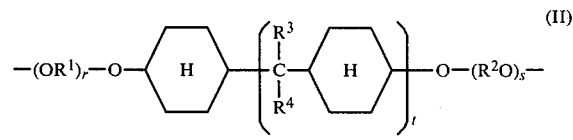

where 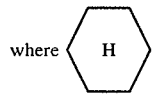

represents a hydrogenated benzene ring, $R^1$ and $R^2$ each represents an alkylene group of 2-4 carbon atoms, $R^3$ and $R^4$ each represents a hydrogen atom or an alkyl group of 1-6 carbon atoms, r and s each represents an integer of from 0 to 3 and t represents an integer of 0 or 1.

5 Claims, No Drawings

PHOTOSENSITIVE LITHOGRAPHIC PLATE WITH SULFONATE CONTAINING PHOTOSENSITIVE POLYESTER

BACKGROUND OF THE INVENTION

1. Field of the Invention

The present invention relates to a photosensitive lithographic plate of high sensitivity, excellent in chemical resistance and abrasion resistance and being capable of developing with water or weakly alkaline aqueous solution.

2. Description of the Prior Art

Various studies have hitherto been made for unsaturated polyester resins in which skeltons of cinnamic acid are introduced to side or main chains of high molecular structures and it is well known that such resins have been already applied as photosensitive resin layers for lithographic plates. However, in the known photosensitive lithographic plates using the unsaturated polyester resin containing cinnamic acid skeltons, a developer mainly composed of organic solvent has to be used for leaching out unexposed portion since the resin is soluble generally only in an organic solvent. This results in economical disadvantages, as well as brings about sanitary problems in view of the working circumstance and further leads to troubles such as the treatment of liquid wastes of the spent developer.

In view of the foregoings, recent studies have been directed earnestly to photosensitive lithographic plates being capable of being developed with water or weakly alkaline aqueous solution. For instance, Japanese Patent Laid-Open No. 130897/1977 proposes a photosensitive material being capable of being developed with an alkaline aqueous solution which comprises, as a photosensitive layer, an unsaturated resin containing in the main chain the residue of oxymonocarboxylic acid derived from alkyl hydroxy alkoxy cinnamate and the residue of aromatic hydrocarbon having sulfo group.

However, since the photosensitive lithographic plates of the prior art were not quite satisfactory with respect to their sensitivity, chemical resistance, abrasion resistance or the like, a further improvement has still been desired.

The present inventors, taking notices of the foregoings, have made a study on a photosensitive lithographic plate which is highly sensitive, excellent in the chemical resistance and the abrasion resistance and capable of being developed with water or weakly alkaline aqueous solution and, as the result, have found that the above object can be attained by the use of a photosensitive polyester containing, as essential ingredients, a particular aromatic dicarboxylic acid unit, a particular dicarboxylic acid unit having sulfonate group and a particular diol unit containing hydrogenated benzene ring.

We have also found that the chemical resistance, the ink affinity and the abrasion resistance can be improved further by the combined use of a photopolymerization initiator and an ethylenically unsaturated compound having at least two terminal unsaturation double bonds which make possible addition polymerization.

As photosensitive compositions comprising an unsaturated compound and a photopolymerization initiator added to a photosensitive polyester, there are proposed various compositions for use in relief printing resin being capable of being developed with water, which comprise a binder polyester resin using a sulfo-containing dicarboxylic acid as a polyester forming component and contain an unsaturated compound having carbon-carbon double bonds which make possible addition polymerization and an initiator for photochemical reaction (for example, refer to Japanese Patent Publication No. 6191/1973 and Japanese Patent Laid-Open No. 105888/1974). However, these compositions have significant drawbacks as the material for lithographic plates in that the sensitivity thereof is extremely decreased upon photoirradiation under an oxygen atmosphere, basically, due to the fact that the polyester itself as the binder resin is not capable of being cross-linked to be insolubilized by the photochemical reactions, in that long time pretreatment under a particular inert gas atmosphere is required for the prevention of effects caused by the presence of minor amount of oxygen dissolved in the photosensitive layer or in that it has less affinity to a lithographic printing ink which is more oleophilic that relief printing ink after the photocuring since the composition itself is highly hydrophilic. There are further proposed those photosensitive compositions for use in dry film or releasing development containing a photo-cross-linkable polymer having cinnamic groups, cinnamylidene acetic groups, furylacrylic groups in the main or side chains and, added thereto, an ethylenically unsaturated monomer having at least two terminal double bonds making possible addition polymerization and a photopolymerization initiator (for example in Japanese Patent Publication No. 12857/1981 and Japanese Patent Laid-Open No. 161538/1981). However, these compositions can not, naturally, be developed at all with water or weakly alkaline aqueous solution containing no organic solvent. Besides, the main purpose of these compositions resides in the improvement or control in their adhesion property to a substrate by adding an ethylenically unsaturated monomer as a liquid substance having plasticizing effect.

According to the composition of the present invention, there is provided a lithographic plate which is capable of developing with water or weakly alkaline aqueous solution containing no organic solvent that can compensate for the defects of the known photosensitive compositions and which is more excellent in the ink affinity, the chemical resistance and the abrasion resistance and of high sensitivity that can be used as a printing plate in a lithographic process in which printing is carried out while utilizing the most delicate balance between the hydrophilic property and the oleophilic property in the art of printing.

SUMMARY OF THE INVENTION

Referring more specifically to the present invention, the photosensitive polyester according to the present invention comprises at least (A):

(a) an aromatic dicarboxylic acid unit represented by the general formula:

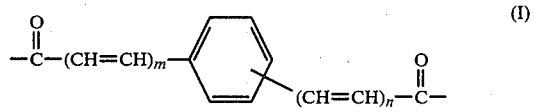

wherein m and n each represents an integer of 0 or 1, with at least one of them being 1, (b) a dicarboxylic acid unit having sulfonate group, and (c) a diol unit represented by the general formula:

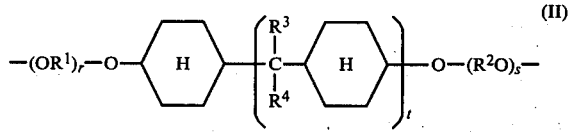

where 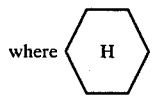

represents a hydrogenated benzene ring, $R^1$ and $R^2$ each represents an alkylene group of 2–4 carbon atoms, $R^3$ and $R^4$ each represents hydrogen atom or an alkyl group of 1–6 carbon atoms, r and s each represents an integer of from 0 to 3, and t represents an integer of 0 or 1.

DESCRIPTION OF THE PREFERRED EMBODIMENTS

The aromatic dicarboxylic acid unit (a) represented by the above general formula (I) is introduced, for example, from p-phenylene diacrylic acid, m-phenylene diacrylic acid, p-carboxy cynnamic acid, m-carboxy cinnamic acid and their derivatives such as alkyl esters. In view of the sensitivity, those represented by the general formula (I) wherein m=n=1 are particularly preferred.

The aromatic dicarboxylic acid is preferably contained in the photosensitive polyester usually in a range between 5–45 mol % and, particularly, between 15–40 mol %.

Dicarboxylic acid unit (b) having sulfonate group is introduced, for example, from 5-sodium sulfoisophthalic acid, 5-potassium sulfoisophthalic acid or their derivatives such as alkyl esters and hydroxyalkyl esters, 3-sodium sulfophthalic acid, 3-potassium sulfophthalic acid, 4-sodium sulfophthalic acid, 4-potassium sulfophthalic acid or their derivatives such as alkyl esters and hydroxyalkyl esters, 2-sodium sulfoterephthalic acid, 2-potassium sulfoterephthalic acid or their derivatives such as alkyl esters and hydroxyalkyl esters, α-sodium sulfosuccinic acid, α-potassium sulfosuccinic acid, β-sodium sulfoadipic acid, β-potassium sulfoadipic acid, 2,5-disodium sulfoadipic acid, 2,5-dipotassium sulfoadipic acid or their derivatives such as alkyl esters and hydroalkyl esters and, preferably, derived from dimethyl 5-sodium sulfoisophthalate, dibutyl 2-sodium sulfoterephthalate and the like.

The dicarboxylic acid unit having sulfonate group may be contained, sufficiently, by more than 5 mol % in the photosensitive polyester. However, since the adhesiveness to the support and the affinity to highly oleophilic lithographic ink are tend to decrease with the increase of the content, it is preferably used in a range usually of less than 40 mol % and, particularly, between 10–35 mol %.

The aromatic dicarboxylic acid unit (a) and the dicarboxylic acid unit having sulfonate group (b) constitute the dicarboxylic acid component in the photosensitive polyester according to the present invention and, in view of the sensitivity and the developing property, a preferred ratio of the unit (a) to the unit (b) is between 1:0.1–10 (molar ratio) and, particularly, 1:0.25–3 (molar ratio).

The diol unit (c) represented by the above general formula (II) is derived, for example, from 1,4-bis(β-hydroxyethoxy)cyclohexane, 1,4-bis(β-hydroxypropoxy)cyclohexane, cyclohexane-1,4-diol or their derivatives, hydrogenated bisphenol-F, hydrogenated bisphenol-A or their derivatives in which ethylene oxide or propylene oxide is added to the hydroxy group thereof. In view of the chemical resistance and the abrasion resistance of the polymer obtained,

in the above general formula (II) is preferably a ring with high degree of hydrogenation, cyclohexane ring being most preferred. For $R^1$ and $R^2$, it is preferred that they contain at least one of linear or branched alkylene groups in view of the ink affinity of the polymer obtained.

As the diol component in the photosensitive polyester according to the present invention, the diol unit (c) represented by the above general formula (II) may be used alone or in combination with other diol component, that is, an aliphatic diol unit (d) in order to improve the reactivity with the dicarboxylic acid component or the balance between the ink affinity and the developing speed. Usually, the diol unit (c) represented by the above general formula (II) and the aliphatic diol unit (d) is combined, preferably, at a ratio between 1:0.2–5 (molar ratio).

The aliphatic diol unit (d) usable herein includes, for example, those aliphatic diols such as ethylene glycol, propylene glycol, diethylene glycol, dipropylene glycol, triethylene glycol, tetraethylene glycol, neopentyl glycol, 2,2-diethyltrimethylene glycol, 2,2-dipropyltrimethylene glycol, 2-ethyl-2-propyltrimethylene glycol, 1,3-propanediol, 1,4-butanediol and 1,5-pentanediol. In view of the water solubility, the chemical resistance and the like of the polymer obtained, those diols having ether bond such as diethylene glycol, triethylene glycol and tetraethylene glycol are particularly preferred. The photosensitive polyester according to the present invention can be produced with ease by any known process for forming the above units (a)–(c) or the units (a)–(d), for example, by the process disclosed in U.S. Pat. No. 3,622,320.

Namely, it can be produced with ease using an ester derivative of the aromatic dicarboxylic acid represented by the general formula (I), an ester derivative of the dicarboxylic acid having sulfonate group and, optionally, other well known ester derivative of the dicarboxylic acid as the constituent for the dicarboxylic acid unit, mixing them with at least one diol component in the diols represented by the above general formula (II) and, optionally, other diol as the diol unit component, heating to dissolve them, then adding a titanium type catalyst to carry out ester exchange reaction, thereafter, gradually decreasing the pressure and increasing the temperature and distilling off the excess diols and the diols resulted upon proceeding of polycondensation.

In the present invention, the use of photosensitive polyesters having a reduced viscosity (in 0.25 g/dl N,N-dimethylformamide solution at 30° C.) of 0.1–1.5 and, particularly, 0.2–0.8 is preferred in view of the improvement in the sensitivity with no degradation in the developing performance.

In addition to the photosensitive polyester (A) containing the units (a)–(c) or the units (a)–(b) as mentioned above, the photosensitive layer in the present invention may further comprise an ethylenically unsaturated compound (B) having a photopolymerization initiator (c) and at least two terminal unsaturated double bonds which make possible addition polymerization.

The ethylenically unsaturated compound (B) having at least two terminal unsaturated double bonds enabling addition polymerization means monomer, or polymer that takes place addition polymerization and is substantially insolubilized upon irradiation of actinic rays in the presence of a photopolymerization initiator which will be described later in more detail. The monomer may involve herein dimers, trimers and oligomers in addition to monomers in their strict meanings.

Examples of the ethylenically unsaturated monomer having addition-polymerizable terminal unsaturated double bonds include, for example, esters of unsaturated carboxylic acid and aliphatic polyhydroxy compounds, esters of unsaturated carboxylic acids and aromatic polyhydroxy compounds, and esters obtained by the esterification of unsaturated carboxylic acids and polybasic carboxylic acids with polyhydroxy compounds such as the aliphatic polyhydroxy compounds and the aromatic polyhydroxy compounds as mentioned above or modified products of these esters.

Specific examples of the unsaturated carboxylic acids include acrylic acid, methacrylic acid and itaconic acid.

The aliphatic polyhydroxy compounds include, for example, dihydric alcohols, such as ethylene glycol, diethylene glycol, triethylene glycol, tetraethylene glycol, neopentyl glycol, propylene glycol, dipropylene glycol, 1,4-butanediol and 1,2-butanediol, trihydrical-cohols such as trimethylolethane, trimethylolpropane and glycerol, tetrahydric or more than tetrahydric alcohols such as pentaerythritol and tripentaerythritol and polyhydric hydroxy carboxylic acids such as dihydroxy maleic acid.

The aromatic polyhydroxy compounds include, for example, hydroquinone, resorcin, catechol and pyrogallol.

The polybasic carboxylic acids include, for example, phthalic acid, isophthalic acid, terephthalic acid, tetrachlorophthalic acid, trimellitic acid, pyromellitic acid, benzophenone dicarboxylic acid, maleic acid, fumaric acid, malonic acid, glutaric acid, adipic acid, sebacic acid and tetrahydrophthalic acid.

The esters of aliphatic polyhydroxy compounds and unsaturated carboxylic acids include, for example, acrylates such as ethylene glycol diacrylate, triethylene glycol diacrylate, tetramethylene glycol diacrylate, trimethylolpropane triacrylate, trimethylolethane triacrylate, pentaerythritol diacrylate, pentaerythritol triacrylate, pentaerythritol tetraacrylate, dipentaerythritol tetraacrylate, dipentaerythritol pentaacrylate, dipentaerythritol hexaacrylate, tripentaerythritol octaacrylate and glycerol diacrylate, methacrylates such as triethylene glycol dimethacrylate, tetramethylene glycol dimethacrylate, trimethylolpropane trimethacrylate, trimethylolethane trimethacrylate, pentaerythritol dimethacrylate, pentaerythritol trimethacrylate, pentaerythritol tetramethacrylate, dipentaerythritol dimethacrylate, dipentaerythritol trimethacrylate, dipentaerythritol tetramethacrylate, tripentaerythritol octamethacrylate, ethylene glycol dimethacrylate, 1,2-butanediol dimethacrylate and sorbitol tetramethacrylate; itaconates such as ethylene glycol diitaconate, propylene glycol diitaconate, 1,2-butanediol diitaconate, tetramethylene glycol diitaconate, pentaerythritol triitaconate; crotonates such as ethylene glycol dicrotonate, diethylele glycol dicrotonate and pentaerythritol tetracrotonate; and maleates such as ethylene glycol dimaleate, triethylele glycol dimaleate and pentaerythritol dimaleate.

The esters of the aromatic polyhydroxy compounds and the unsaturated carboxylic acids include, for example, hydroquinone diacrylate, hydroquinone dimethacrylate, resorcin diacrylate, resorcin dimethacrylate and pyrogallol triacrylate.

Typical examples of the esters obtained by the esterification of the unsaturated carboxylic acids and the polybasic carboxylic acids, and the polyhydric hydroxy compounds are set forth in Table 1 although they are not simple compounds. In the Table, z represents acryloyl group or methacryloyl group.

TABLE 1

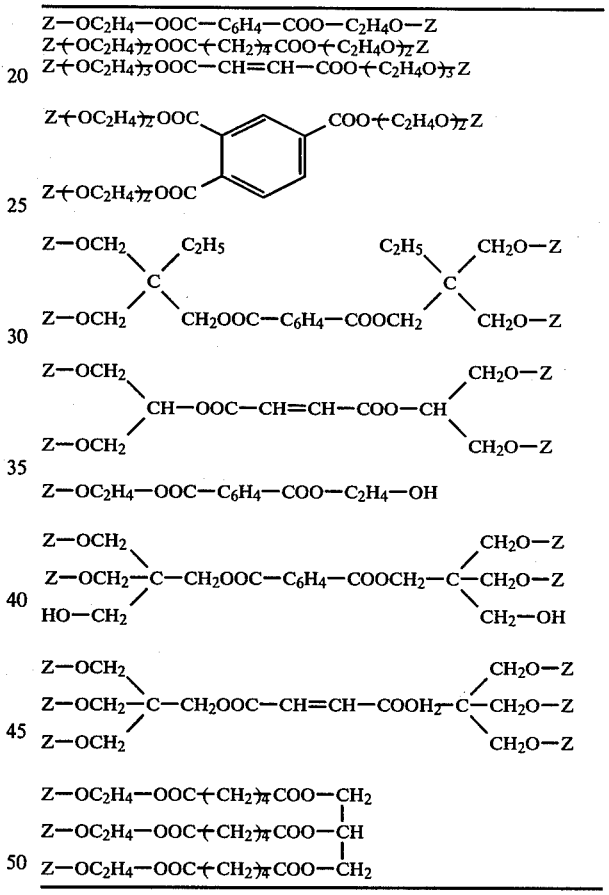

Referring further to the compounds having ethylenically unsaturated double bonds usable in this invention, they include, for example, acrylamides such as ethylene bisacrylamide and hexamethylene bisacrylamide, methacrylamides such as ethylene bismethacrylamide and hexamethylene bismethacrylamide, allyl esters such as diallyl phthalate, diallyl malonate, diallyl fumarate and triallyl isocyanurate, and vinyl-containing compounds such as divinyl adipate, divinyl phthalate and ethylene glycol divinyl ether.

The modified ethylenically unsaturated monomers having terminal unsaturated double bonds enabling addition polymerization include, for example, monomers containing free carboxylic acid as disclosed in Japanese Patent Application No. 210920/1981, which can be prepared through the reaction of (metha)acrylate containing hydroxyalkyl group and acid anhydride of dibasic carboxylic acid.

The (metha)acrylates containing hydroxyalkyl group include polyvalent esters such as trimethylolethane diacrylate, trimethylolpropane diacrylate, trimethylolpropane dimethacrylate, glycerol diacrylate, glycerol dimethacrylate, pentaerythritol diacrylate, pentaerythritol dimethacrylate, pentaerythritol triacrylate, pentaerythritol trimethacrylate and dipentaerythritol tetraacrylate.

The acid anhydrides for reaction with the (metha)acrylates containing hydroxyalkyl group include, for example, succinic anhydride, maleic anhydride, itaconic anhydride, phthalic anhydride, hexahydrophthalic anhydride and tetrahydrophthalic anhydride.

The (metha)acrylate compounds having the carboxyl group may be prepared by the semiesterification reaction between the (metha)acrylates having the hydroxyalkyl group and the acid anhydrides as mentioned above, and desired reaction conditions are such that the mixture of both of the reactants is heated with or without reaction solvent in the presence of a so-called heat polymerization inhibitor and in an optional presence of catalyst such as pyridine, tertiary amine, sulfuric acid and p-toluene sulfonic acid. Benzene, toluene, methyl ethyl ketone, dioxane or the like is useful as the reaction solvent.

Among the ethylenically unsaturated compounds having at least two terminal unsaturated double bonds enabling addition polymerization, those containing alcoholic hydroxy groups, phenolic hydroxy group or free carboxyl groups in the molecule, for example, (metha)acrylic esters such as pentaerythritol triacrylate and the products modified with succinic anhydride are particularly preferred in view of the developing performance in water or weakly alkaline aqueous solution containing no organic solvent.

The ethylenically unsaturated compound is used in a range from 5 to 200 parts by weight and, preferably, from 10 to 100 parts by weight per 100 parts by weight of the photosensitive polyester as mentioned above.

The photopolymerization initiator (C) is the one which produces radicals under the irradiation of actinic rays and brings about addition polymerization for the ethylenically unsaturated compound (B) having at least two terminal unsaturated double bonds enabling addition polymerization as mentioned above.

The photopolymerization initiators usable in the present invention are required to initiate photopolymerization reaction efficiently without hindering the photo-crosslinking reaction of the photosensitive polyester mentioned above. Furthermore, since most of optical sources which are employed for the working step of drawing picture images by the irradiation of actinic rays on the photosensitive lithographic plate usually issue optical energy at a wave length higher than 340 nm, it is necessary that the initiators take place the photopolymerizing reaction efficiently in the above wave length region. Further, although the photo-crosslinking reaction of the photosensitive polyester can be carried out sufficiently when the polyester is used alone, a suitable sensitizer is usually be added into the photosensitive layer as described hereinafter in order to attain an actually required sensitivity. By taking into consideration the optical energy distribution of the optical source for use in the drawing of picture images, the sensitizer is also prepared with such a chemical design that the optical energy can be converted into the photo-crosslinking reaction efficiently.

As described above, it is necessary for the photopolymerization initiators (C) in the present invention that they can intensely initiate the photo addition polymerization of the ethylenically unsaturated compound (B) having at least two terminal unsaturated double bonds enabling of addition polymerization, being well compatible with the light absorption of the sensitizer added for the improvement of the optical energy distribution from the optical source and the promotion of the photo-crosslinking reaction, in parallel with the occurrence for the photo-crosslinking of the photo-crosslinkable polyester.

As the result of the investigation in view of the foregoings, the present inventors have found that a so-called photoinitiator system, that is, the combination of benzil 4,4'-bis(dimethylamino)benzophenone is particularly effective as the photopolymerization initiator for use in the present invention.

This photoinitiator system means specific mixtures that can develop synergistic activating effect as the photopolymerization initiator in the photopolymerizing reaction when used as a mixture of specific compounds and produce excellent effects that are far beyond anticipation in the case where each of the compounds is used individually.

Preferred combinations as the examples of the photoinitiator systems include the followings: a combination of compounds such as benzoin, benzoin methyl ether, benzil, fluorenone with 4,4'-bis(dialkylamino)benzophenone as disclosed in Japanese Patent Publication No. 20067/1969, a combination of benzil, fluorenone or substituted benzils disclosed in Japanese Patent Laid-Open No. 106505/1982 with p-dialkylaminophenyl ketones represented by the general formula:

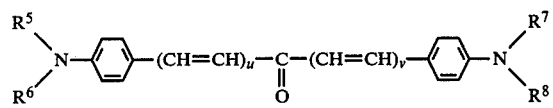

(where $R^5$, $R^6$, $R^7$ and $R^8$ each represents an alkyl group, and u and v each represents 0, 1 or 2), a combination of p-dialkylamino stilbene derivatives represented by the general formula:

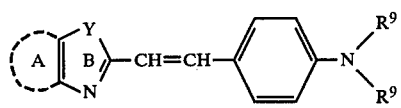

(where $R^9$ represents an alkyl group, Y represents a bivalent atom or atomic group selected from —O—, —S—, —Se—, —CH=CH—NR$^{10}$—, which forms a heterocyclic aromatic ring B together with a trivalent nitrogen atom, $R^{10}$ represents hydrogen or an alkyl group, and ring A is a benzene or naphthalene ring which may be substituted, and is condensed with the ring B), with hexaaryl biimidazole disclosed in Japanese Patent Laid-Open No. 21401/1982, a combination of a p-dialkylamino cinnamylidene derivative represented by the general formula:

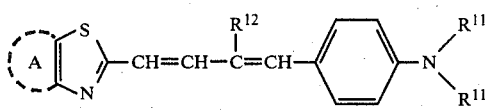

(where $R^{11}$ represents an alkyl group, $R^{12}$ represents hydrogen atom or an alkyl group, ring A represents a benzene or naphthalene ring which may be substituted and is condensed with a thiazole ring), with hexaaryl biimidazole disclosed in Japanese Patent Application No. 118339/1981 combination of a cyanine dye represented by the general formula:

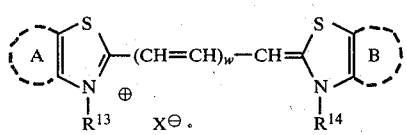

(where $R^{13}$ and $R^{14}$ each represents an alkyl group, ring A and ring B represent individually benzene or naphthalene rings which may be substituted, $X^{\ominus}$ represents an anion and w represents 0 or 1), or thiapyrylium salt with a S-triazine derivative represented by the general formula:

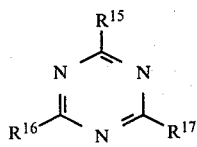

(where $R^{15}$, $R^{16}$ and $R^{17}$ each represents an alkyl group or aryl group, or a alkenyl group, pyperidino group, —$NR_2$, —OR, —S in which R represents hydrogen atom or an alkyl group, at least one of them being mono-, di- or tri-halogen substituted methyl group, as disclosed in Japanese Patent Application No. 128406/1981 and Japanese Patent Application No. 139484/1981.

While any of them can be used satisfactorily, the combination of such compounds as benzoin, benzoin methyl ester, benzil and fluorenone with 4,4'-bis(dialkylamino)benzophenone is most preferred.

It is advantageous to use each of the specific compounds as the constituent of the photoinitiator system by the addition amount in a range from 0.1 to 20% by weight, and preferably, from 1 to 10% by weight in the photosensitive layer.

It is also very useful to add a phenolic hydroxy group-containing resin (D) in addition to the above mentioned ingredients. Addition of the resin containing phenolic hydroxy group can significantly improve the water proofness of the lithographic plate in the not-exposed state.

Such resins include, for example, so-called phenolic resin which are synthesized from the phenols and aldehydes or ketones by the addition condensation, polyhydroxy phenyl resins as represented by poly-p-hydroxystyrene, or polyhydroxyphenyl resin further containing other substituents. In addition, those resin which are partially esterified by reacting the phenolic hydroxy groups in the resin with acid chloride such as cinnamic acid chloride and (metha)acrylic acid chloride modified so as to contain free carboxylic acid residue partially by reacting with acid anhydride such as succinic anhydride and phthalic anhydride.

The resin containing phenolic hydroxy groups is used usually in a range from 1 to 500 parts by weight and, preferably, from 5 to 150 parts by weight to 100 parts by weight of the photocrosslinkable polyester.

The photosensitive lighographic plate according to the present invention is prepared by coating, on a substrate, the photosensitive polyester composition containing a photosensitive polyester in the manner as stated above.

The photosensitive composition according to the present invention is generally produced by dissolving the photosensitive polyester as mentioned above into a solvent and, optionally, also dissolving other ingredients in the solution.

While different depending on the composition and the molecular weight of the polymer, preferred solvent include, in the case where the content of dicarboxylic acid unit containing sulfonate groups is low, for example, chloric solvent such as methylene chloride, chloroform, trichloroethane, chlorobenzene and dichlorobenzene, alcoholic solvent such as furfuryl alcohol, tetrahydrofurfuryl alcohol and benzyl alcohol, ethylene glycol monoalkyl ether and diethylene glycol monoalkyl ether type solvent such as ethylene glycol monomethyl ether, ethylene glycol monoethyl ether, ethylene glycol monopropyl ether, diethylene glycol monomethyl ether, diethylene glycol monoethyl ether and diethylene glycol monopropyl ether, ester type solvent such as ethylene glycol ethylether acetate, diethylene glycol ethylether acetate and ethyl acetate, nitrogen-containing type solvent such as dimethylformamide, methylpyrrolidone, nitroethane and nitrobenzene, ketone type solvent such as methyl ethyl ketone, methyl isobutyl ketone, cyclohexanone, methylcyclohexanone and 4-methyl-4-methoxy-2-pentanone, as well as dimethyl sulfoxide.

In the case where the content of the dicarboxylic acid unit containing sulfonate group is higher, the solubility thereof changes greatly and in this case there are some combinations which are less soluble in the solvents as mentioned above.

As the solvent for such photosensitive polyester, those solvents are particularly effective including keto alcohols such as diacetone alcohol, methyl lactate, ethyl lactate, n-butyl lactate and i-butyl lactate, or hydroxy-containing aliphatic acid esters, as well as water.

The photosensitive layer according to the present invention may be incorporated, as required, with various other known ingredients than above. For instance, additives such as other resin, pigment, plasticizer, stabilizer, dye and sensitizer may be contained in such a range as not hinder the developing property to water or weakly alkaline aqueous solution. These additives may be added during the preparation of the photosensitive polyester composition.

In the present invention, addition of a film-forming resin soluble in organic solvent by a range between 2–50 parts by weight and, preferably, between 5–45 parts by weight to 100 parts by weight of the photosensitive polyester is preferred for significantly improving the ink affinity.

Such film forming resins soluble in organic solvent include, for example, cellulose derivatives such as cellulose acetate butyrate, cellulose acetate propionate, cellulose acetate phthalate, cellulose hydrogen phthalate and ethyl cellulose, acetalized resins such as polyvinyl formal and polyvinyl butyral or copolymers having partial structural unit thereof, polyacrylates, polymethacylates, polyesters, polyurethanes and epoxy resins.

Among them, cellulose acetate butyrate, ethyl cellulose and polyvinyl butyral are preferred particularly.

Preferred sensitizers include, for example, benzophenone derivatives such as Michler's ketone, diethylaminoethyl benzophenone and thiomichler's ketone; benzanthrone derivatives such as benzanthrone, 6,11-dichlorobenzanthrone, 11-chloro-6-hydroxybenzanthrone and 1-carboethoxy-2-keto-3-methyl-3-aza-1, 9-benzanthrone; quinones such as 1,8-dichloroanthraquinone, 1,8-dimethoxyanthraquinone and 1,2-benzanthraquinone, pyrylium or thiapyrylium salts such as 2,4,6-triphenyl-pyrylium tetrafluoro borate, 2,4,6-triphenyl-thiapyrylium tetrafluoro borate, 4-(4-butoxyphenyl)-2,6-diphenylpyrylium tetrafluoroborate, 4-(4-butoxyphenyl)-2,6-diphenylthiapyrylium tetrafluoroborate, 4-(4-butoxyphenyl)-2,6-di-(4-methoxyphenyl) pyrylium tetrafluoro borate, 4-(4-butoxyphenyl)-2,6-di-(4-methoxyphenyl)thiapyrylium fluoro borate or their corresponding hexafluoro phosphate; mono- or polynitro compounds such as 5-nitroacenaphthene, 2-nitrofluorenone, 2,7-dinitrofluorene, 1-nitronaphthalene and 1,5-dinitronaphthalene; naphthotiazoline derivatives such as 2-dibenzoyl methylene-3-methyl-$\beta$-naphthothiazoline, 2-benzoylmethylene-3-methyl-$\beta$-naphthothiazoline and 2-di(2-furoyl)methylene-3-methyl-$\beta$-naphthothiazoline.

Known thermal polymerization inhibitors can, for example, be mentioned as the stabilizer and those used preferably include hydroquinone, methylhydroquinone, p-methoxyphenol, pyrogallol, catchecol, 2,6-di-t-butyl-p-cresol and $\beta$-naphthol.

A photosensitive lithographic plate can be produced by coating the photosensitive polyester composition according to the present invention by way of a conventional method onto a substrate made of high molecular film or metal plate such as polyethylene terephthalate, printing zinc plate, printing aluminum plate, silicon wafer and chromium-vapor deposited glass plate using well known coating methods such as dip coating, coating rod, spinner coating and spray coating.

As the substrate for use in the present invention, a printing aluminum plate whose surface is subjected to anodic oxidization is preferred and a plate subjected to anodic oxidization in the bath of phosphoric acid or an mixture consisting of phosphoric acid and sulfuric acid is particularly preferred since it has a good adhering property with the photosensitive polyester according to the present invention.

By exposing a copy material laid over a photosensitive lighographic plate or irradiating electron beams on the plate to prepare picture images and, thereafter, developing them using water or a weakly alkaline aqueous solution by conventional ways, corresponding picture images can be formed on the substrate. Particularly, since satisfactory development can be obtained without incorporation of organic solvent to the liquid developer, the present invention is superior over the prior art. Of course, excellent developing performance can also be obtained with an alkaline aqueous solution containing a small amount of hydrophilic organic solvent.

As has been described specifically for the present invention, the photosensitive polymer contained in the photosensitive polyester composition according to the present invention has advantageous features in that it can be developed using water or weakly alkaline aqueous solution, and that the printing plate thus obtained is excellent in the chemical resistance and the abrasion resistance, as well as in the ink affinity.

Having generally described the invention, a more complete understanding can be obtained by reference to certain specific examples, which are included for purposes of illustration only and are not intended to be limiting unless otherwise specified.

EXAMPLE 1

To a polymerization tube made of glass, were charged 2.74 g (10 mmol) of diethyl p-phenylene diacrylate, 2.96 g (10 mmol) of dimethyl 5-sodium sulfoisophthalate and 9.79 g (48 mmol) of 1,4-bis(2-hydroxyethoxy)cyclohexane and 1 ml of 3% ethanol solution of isopropyl orthotitanate was added as the catalyst. Then, ester exchange reaction was carried out while passing nitrogen gas at 220° C. for about one hour and, thereafter, ethanol and methanol formed were distilled off. Then, the bath temperature was increased to 250° C., at which reaction was carried out under a reduced pressure of 1 mmHg for about one hour and excess diol was distilled off. After cooling, the glass tube was broken to obtain transparent polyester ①. The polyester had a reduced viscosity ($\eta$sp/c, in 0.25 g/dl of N,N-dimethylformamide solution at 30° C.) (the reduced viscosities for polyesters were measured in the same manner as above in all of the following examples) of 0.11 and it was water soluble to such as extent as to provide its 10 wt.% clear aqueous solution.

The polyester was used to prepare 4 wt.% diacetone alcohol solution. Then, 2-dibenzoylmethylene-3-methyl-$\beta$-naphthothiazoline (referred to hereinafter as DBT) was added in an amount of 5% by weight based on the polyester and crystal violet was further added for coloration to prepare a photosensitive liquid (1). The photosensitive liquid was coated using a whirler on an aluminum plate which had been sand-blasted and further subjected to anodic oxidation in a phosphoric acid solution. The photosensitive plate (1) was exposed through a step wedge with a step difference of 0.15 using a 3 KW high pressure mercury lamp from the distance of 1 m for 100 sec.

Upon developing the plate by gently rubbing with a soft cloth for several seconds under the flow of tap water, insolubilization was observed to an extent of fourth step. When developing usual ink for lithographic process was deposited on the images thus obtained, the ink affinity (deposition) was found to be satisfactory. The picture images obtained by the exposure and the development were subjected to chemical resistance tests using petroleum type solvent and alcoholic type solvent respectively, revealing that no changes were observed in the image areas.

EXAMPLE 2

Into a three-necked flask equipped with a stirrer, a nitrogen gas inlet pipe and a cooler, were charged 13.7 g (50 mmol) of p-phenylene diacrylic acid, 14.8 g (50 mmol) of dimethyl 5-sodium sulfoisophthalate and 48.9 g (240 mmol) of 1,4-bis-(2-hydroxyethoxy)cyclohexane, and 0.15 g of isopropyl orthotitanate were added as the catalyst. Then, the bath temperature was gradually increased under stirring while introducing nitrogen gases. Ester exchange reaction was carried out while maintaining them at 200° C. for one hour and then the temperature was increased to 250° C. to carry out polycondensation reaction under a reduced pressure of 1 mmHg for 30 minutes to obtain a transparent resin polyester ②. The polyester had a reduced viscosity of 0.54 and it formed a transparent 10 wt.% aqueous solution.

A photosensitive liquid (2) was prepared in the same manner as in Example 1 and coated on an aluminum plate to prepare a photosensitive plate (2). The photosensitive plate, when measured, showed a sensitivity three times as high as that in Example 1.

EXAMPLE 3

In the same manner as in Example 1, 2.74 g (10 mmol) of diethyl p-phenylene diacrylate, 2.96 g (10 mmol) of dimethyl 5-sodium sulfoisophthalate, 3.28 g (10 mml) of ethylene oxide (2 molar) addition product of hydrogenated bisphenol-A ("Rikaresin" HEO-20, manufactured by Shin Nihon Rika Co., Ltd.) and 10.5 g (70 mmol) of triethylene glycol were measured into a polymerization tube made of glass and 1 ml of 3 wt.% ethanol solution of isopropyl orthotitanate was added as the catalyst. Then, ester exchange reaction was carried out at 240° C. for one hour while feeding nitrogen.

Then, the temperature was increased to 250° C. and reaction was carried out under a reduced pressure of 0.25 mmHg for 30 minutes to obtain a clear resin (polyester ③) having a reduced viscosity of 0.27. The resin forms a transparent 10 wt.% aqueous solution. A photosensitive liquid (3) was prepared quite in the same manner as in Example 1 and coated onto an aluminum plate to prepare a photosensitive plate (3). The photosensitive plate, when measured, showed a sensitivity twice as high as that in Example 1.

EXAMPLE 4

Into a polymerization tube made of glass, were measured 2.74 g (10 mmol) of diethyl p-phenylene diacrylate, 4.45 g (10 mmol) of dioctyl sodium sulfosuccinate, 1.44 g (6 mmol) of hydrogenated bisphenol-A ("Rikabinol" HB, manufactured by Shin Nihon Rika Co., Ltd.) and 2.40 g (16 mmol) of triethylene glycol, and 1 ml of 3 wt.% ethanol solution of isopropyl orthotitanate was added as the catalyst. Then, ester exchange reaction was carried out at 200° C. for one hour while feeding nitrogen, followed by polycondensation reaction under a reduced pressure of 1.2 mmHg for 30 minutes. A clear resin (polyester ④) thus obtained was soluble in water, diacetone alcohol and cyclohexane to form transparent 10 wt.% aqueous solution in each case.

A photosensitive liquid (4) was prepared using the above resin in the same manner as in Example 1 to prepare a photosensitive plate (4). When the photosensitive plate was exposed in the same manner as in Example 1 and then developed using aqueous solution containing 5.5% of sodium silicate and 1.2% of sodium hydroxide, the photosensitive layer at the not-exposed area could be removed completely and the ink affinity in the obtained image area was very excellent.

EXAMPLES 5-8

95 parts of the polyester ③ and 5 parts of each film-forming resin soluble in organic solvent as shown in Table 1 were dissolved in diacetone alcohol to prepare a 4 wt.% diacetone alcohol solution. DBT was added to the solution in an amount of 5% by weight based on the total amount of the polymer and crystal violet was further added for coloration to prepare a photosensitive liquids (5)-(8). Then, they were coated on aluminum plates in the same manner as in Example 1 to prepare photosensitive lithographic plates (5)-(8).

Then, each of the photosensitive lithographic plates was directly exposed to a 3 KW high pressure mercury lamp from the distance of 1 m for 100 seconds and, thereafter, developed by being gently rubbed with soft cloth for several seconds under the flow of tap water on the exposed surface and then air-dried. The contact angle with deionized water at the surface of the image area thus treated was measured (using a contact angle meter, model Kyowa CA-D, manufactured by Kyowa Kagaku Co., Ltd.) as the index for the water repellent property at the surface of the image area. The results are shown in Table 1 below.

TABLE 1

| | Polymer added | After developed |
|---|---|---|
| Example 3 | None | 78.5° |
| Example 5 | Cellulose acetate butyrate | greater than 90° |
| Example 6 | Polyvinylbutyral | " |
| Example 7 | Polymethyl methacrylate | " |
| Example 8 | Ethylcellulose | " |

As the result of the measurement, it can be seen that the water repellency was significantly be improved and the affinity to usual ink is increased by adding the film-forming resin soluble in organic solvent into the system.

Upon actual printing, roll-up for the image area required only several sheets and satisfactory printing products could be obtained when printed as far as 50,000 sheets.

EXAMPLES 9 AND 10

To a 200 ml three-necked flask, were charged 32.88 g (120 mmol) of diethyl p-phenylene diacrylate, 23.68 g (80 mmol) of dimethyl 5-sodium sulfoisophthalte, 20.40 g (100 mmol) of 1,4-bis(2-hydroxyethoxy)cyclohexane and 42.0 g (280 mmol) of triethylene glycol, and 10 ml of 5% ethanol solution of butyl orthotitanate were added. Then, the temperature was gradually increased under stirring at 200 r.p.m. while feeding nitrogen gases and the ester exchange reaction was carried out at 210° C. for about one hour. Thereafter, the number of rotation for stirring was reduced to 100 r.p.m. and the pressure on the system was gradually decreased in one hour. As soon as the pressure was reduced to 1 mmHg, the bath temperature was rapidly increased to 250° C., under which conditions reaction was carried out for about 30 minutes to obtain a transparent polyester ⑤. The polyester obtained had a reduced viscosity of 0.45.

The polyester was used to prepare 4 wt.% ethylene glycol monomethyl ether solution, to which DBT was added in an amount of 5% by weight based on the polyester.

Further, 40% by weight of pentaerythritol triacrylate ("Biscoat 300", manufactured by Osaka Yuki Kagaku Kogyo Co., Ltd.) and each 2.8% by weight of benzil and Michler's ketone as the photopolymerization initiator were added to the polyester. After confirming that they were dissolved uniformly, Aizen Victoria Pure Blue BOH (C.I. No. 42595) (manufactured by Hodogaya Kagaku Co., Ltd.) was added by 1% by weight based on the polyester, followed by filtration to obtain a photosensitive liquid (9).

The photosensitive liquid (9) was coated on an aluminum plate which had been sand-blasted and subjected to anodic oxidation in a phosphoric acid bath using a whirler to obtain a photosensitive lithographic plate (9).

The printing plate was exposed through a step wedge with a step difference of optical density of 0.15 using 3

KW high pressure mercury lamp from the distance of 1 m for 50 seconds. When it was developed by being gently rubbed with soft cloth under the flow of tap water for several seconds, insolubilization was observed as far as the fifth step. When usual developing ink for lithographic process was deposited to the picture images obtained the ink affinity was very satisfactory and the roll-up for the image area on the printing plate required only several sheets. Further, when the image obtained by the exposure and the development was subjected to chemical resistance test using petroleum type solvent and alcoholic solvent respectively, no changes were recognized at all in the image area (Example 9).

A photosensitive liquid (10) was prepared with no addition of pentaerythritol triacrylate, benzil and Michler's ketone and coated on the aluminum plate as mentioned above using a whirler to prepare a photosensitive lithographic plate (10) (Example 10). For the roll-up of the image area ten and several sheets of paper were required. Further, abrasion resistant test was carried out using petroleum type solvent on both of the photosensitive lithographic plates (9) and (10) and the image area after the abrasion was observed using a scanning type electronic microscope. As the result, it was confirmed that the photosensitive lithographic plate (9) was excellent and improved as compared with the lithographic plate (10).

EXAMPLES 11 and 12

To a 200 ml of three-necked flask, were charged 32.88 g (120 mmol) of diethyl p-phenylene diacrylate, 23.68 g (80 mmol) of dimethyl 5-sodium sulfoisophthalate, 12.24 g (60 mmol) of 1,4-bis(2-hydroxyethoxy)cyclohexane and 42.00 g (280 mmol) of triethylene glycol, and ester exchange reaction was carried out in the same manner as in Example 9.

Then, after reducing the pressure to 1 mmHg in the same manner as in Example 9 at 210° C., the bath temperature was rapidly increased to 240° C., under which conditions the reaction was carried out for 45 minutes.

The reduced viscosity of the polyester ⑥ thus obtained was 0.54. The photosensitive liquids (11) and (12) each of the composition as shown in Table 2 below were prepared using the polyester to obtain photosensitive lithographic plates (11) and (12) in the same manner as in Example 9.

TABLE 2

| Example No. | 11 | 12 |
|---|---|---|
| Photosensitive liquid | (11) | (12) |
| Polyester ⑥ | 1.00 g | 1.00 g |
| DBT | 0.05 g | 0.05 g |
| Biscoat 300 | 0.40 g | — |
| Biscoat 295*[1] | — | 0.40 g |
| Benzil | 0.028 g | 0.028 g |
| Michler's ketone | 0.028 g | 0.028 g |
| Dioctylphthalate | 0.05 g | 0.05 g |
| Aizen Victoria Pure Blue BOH | 0.006 g | 0.006 g |
| Ethylene glycol monomethyl ether | 24.00 g | 24.00 g |

*[1]Trimethylolpropane triacrylate manufactured by Osaka Yuki Kagaku Co., Ltd.

When the lithographic plates thus obtained were exposed and developed in the same manner as in Example 9 respectively, they were insolubilized as far as the eighth and ninth steps respectively.

When the printing plates prepared by using the photosensitive liquid (11) was attached to a printer for the printing test, it showed excellent ink affinity, produced satisfactory printing products after printing up to 150,000 sheets and exhibited extremely excellent printing adaptability.

EXAMPLES 13 AND 14

The photosensitive liquids (13) and (14) each of the composition as shown in Table 3 were prepared using the polyester ⑥ and photosensitive lithographic plates (13) and (14) were obtained in the same manner as in Example 9.

TABLE 3

| Example No. | 13 | 14 |
|---|---|---|
| Photosensitive liquid | (13) | (14) |
| Polyester ⑥ | 0.80 g | 0.80 g |
| Phenolic Resin*[2] | 0.20 g | — |
| Resin MB*[3] | — | 0.20 g |
| Biscoat 300 | 0.40 g | 0.40 g |
| DBT | 0.05 g | 0.05 g |
| Benzil | 0.028 g | 0.028 g |
| Michler's ketone | 0.028 g | 0.028 g |
| Dioctylphthalate | 0.05 g | 0.05 g |
| Aizen Victoria Pure Blue BOH | 0.006 g | 0.006 g |
| Ethylene glycol monomethyl ether | 24.00 g | 24.00 g |

*[2]Manufactured by Sumitomo Durays Co., Ltd.: "Sumilite Resin PR-SK-2"
*[3]Manufactured by Maruzen Sekiyu Co., Ltd.: Brominated products of poly-p-vinylphenol When the photosensitive lithographic plates (13) and (14) were exposed respectively in the same manner as in the previous Example 9 and developed using an alkaline aqueous solution containing 5.5% of sodium silicate and 1.2% of sodium hydroxide, their not-imaged areas were quite clearly removed to show excellent developing performance and insolubilization was observed to an extent of sixth step for each of them. The printing plates, when subjected to abrasion resistant test, showed excellent abrasion resistance as in Example 2 and excellent ink affinity.

Further, when the photosensitive lithographic plate (13) obtained in Example 13 was exposed and developed after the store in a chamber at 60° C. and 90% of humidity for 3 days in the same manner, printing plate with satisfactory image area could be obtained with not-imaged area being removed clearly. When subjected to the abrasion resistant test, the printing plate exhibited excellent abrasion resistance and very satisfactory ink affinity.

EXAMPLES 15 AND 16

Photosensitive liquids (15) and (16) each of the compositions as shown in Table 4 were prepared using the polyester ⑥ to obtain photosensitive lithographic plates (15) and (16) in the same manner as in Example 9.

TABLE 4

| Example No. | 15 | 16 |
|---|---|---|
| Photosensitive liquid | (15) | (16) |
| Polyester ⑥ | 0.80 g | 0.80 g |
| Phenolic Resin*[4] | 0.20 g | 0.20 g |
| Biscoat 300 | 0.20 g | — |
| Modified Biscoat 300*[5] | 0.20 g | 0.40 g |
| DBT | 0.05 g | 0.05 g |
| Benzil | 0.028 g | 0.028 g |
| Michler's ketone | 0.028 g | 0.028 g |
| Dioctylphthalate | 0.05 g | 0.05 g |
| Aizen Victoria Pure Blue BOH | 0.006 g | 0.006 g |
| Ethylene glycol monomethyl ether | 24.00 g | 24.00 g |

*[4]Manufactured by Sumitomo Durays Co., Ltd.: "Sumilite Resin PR-SK-2"
*[5]Biscoat 300 semi-esterified with succinic anhydride When the photosensitive lithographic plates (15) and (16) were exposed respectively in the same manner as in Example 9 and developed using an alkaline aqueous solution containing 5.5% of sodium silicate and 1.2% of sodium hydroxide, not-imaged area was removed quite clearly and the printing plates (15) and (16) were insolubilized to an extent of sixth step and fourth step respectively. The result of the abrasion resistant test and the ink affinity for the printing plates were extremely excellent in both of them.

EXAMPLES 17-20

Photosensitive liquids (17)-(20) each of the compositions as shown in Table 5 were prepared using the polyester ⑥ and photosensitive lithographic plates (17)-(20) were obtained in the same manner as in Example 9.

TABLE 5

| Example No. | 17 | 18 | 19 | 20 |
|---|---|---|---|---|
| Photosensitive liquid | (17) | (18) | (19) | (20) |
| Polyester ⑥ | 1.00 g | 1.00 g | 1.00 g | 1.00 g |
| Biscoat 300 | 0.40 g | 0.40 g | 0.40 g | 0.40 g |
| Tris(trichloromethyl)-S—triazine | 0.028 g | 0.028 g | 0.028 g | — |
| 2,2'-bis(o-chlorophenyl)-4,4',5,5'-tetraphenylbiimidazole | — | — | — | 0.028 g |
| DBT | 0.05 g | 0.05 g | 0.05 g | 0.05 g |
| Cyanine dye NK-1900*[1] | — | 0.01 g | — | — |
| 2,4-di(4-methoxyphenyl)-6-(4-n-butoxyphenyl)-thiapyrylium fluoroborate | — | — | 0.028 g | — |
| Michler's ketone | — | — | — | 0.018 g |
| Dioctylphthalate | 0.05 g | 0.05 g | 0.05 g | 0.05 g |
| Aizen Victoria Pure Blue BOH | 0.006 g | 0.006 g | 0.006 g | 0.006 g |
| Ethylene glycol monomethyl ether | 24.00 g | 24.00 g | 24.00 g | 24.00 g |

*[1] Manufactured by Nihon Kankoshikiso Institute

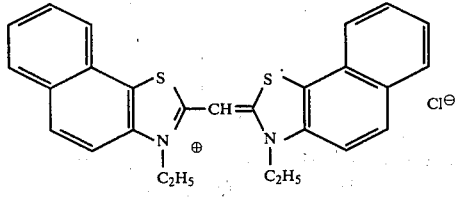

Each of the photosensitive lithographic plates (17)-(20) was exposed through a step wedge a step difference of optical density of 0.15 using a 1 KW metal halide lamp from the distance of 1 m for 60 seconds, developed using an alkaline aqueous solution containing 5.5% of sodium silicate and 1.2% of sodium hydroxide in the same manner as in Examples 13 and 14. The developed images were subjected to the chemical resistant test and the abrasion resistant test using petroleum type solvent and alcohol type solvent, and the image area after the treatment was observed under a scanning electronic microscope. The results of the tests are shown in Table 6.

TABLE 6

| Photosensitive lithographic plate | (17) | (18) | (19) | (20) |
|---|---|---|---|---|
| Number of insolubilized steps | 12 steps | 13 steps | 12 steps | 9 steps |
| Chemical resistance | | | | |
| Petroleum solvent | very good | very good | very good | very good |
| Alcohol solvent | " | " | " | " |
| Abrasion resistance | " | " | " | " |

Further, the ink affinity of the image areas on the printing plates was extremely excellent and the roll-up for the image area on the printer required only several sheets of paper.

EXAMPLES 21-25

Photosensitive liquids (21)-(25) each of the compositions as shown in Table 7 were prepared using the polyester ⑤ to obtain photosensitive printing plates (21)-(25) in the same manner as in Example 9.

TABLE 7

| Example No. | 21 | 22 | 23 | 24 | 25 |
|---|---|---|---|---|---|
| Photosensitive liquid | (21) | (22) | (23) | (24) | (25) |
| Polyester ⑤ | 0.80 g | 0.80 g | 0.80 g | 0.80 g | 0.80 g |
| Phenolic resin*[1] | 0.20 g | 0.20 g | 0.20 g | 0.20 g | 0.20 g |
| Biscoat 300 | 0.20 g | 0.40 g | 0.60 g | 0.80 g | — |
| Modified Biscoat 300*[2] | — | — | — | — | 0.40 g |
| DBT | 0.05 g | 0.05 g | 0.05 g | 0.05 g | 0.05 g |
| Benzil | 0.028 g | 0.028 g | 0.028 g | 0.028 g | 0.028 g |
| Michler's ketone | 0.028 g | 0.028 g | 0.028 g | 0.028 g | 0.028 g |
| Dioctylphthalate | 0.05 g | 0.05 g | 0.05 g | 0.05 g | 0.05 g |
| Aizen Victoria Pure Blue BOH | 0.006 g | 0.006 g | 0.006 g | 0.006 g | 0.006 g |
| Ethylene glycol monomethyl ether | 24.00 g | 24.00 g | 24.00 g | 24.00 g | 24.00 g |

*[1] Manufactured by Sumitomo Durays Co., Ltd.: "Sumilite Resin PR-SK-2"
*[2] Biscoat 300 semi-esterified with succinic anhydride The photosensitive lithographic plates (21)-(25) were exposed and developed using an alkaline aqueous solution containing 5.5% of sodium silicate and 1.2% of sodium hydroxide in the same manner as in Example 9.

All of the developed image areas had satisfactory chemical resistance, abrasion resistance and ink affinity.

The water proofness for the not-exposed area was also very satisfactory.

EXAMPLES 26-29

Polyesters ⑦ - ⑩ were prepared under conditions as shown in Table 8, and photosensitive liquids (26)-(29) each of the compositions as shown in Table 9 were prepared using these polyesters in the same manner as in Example 9 to obtain photosensitive lithographic plates (26)-(29).

TABLE 8

| Polyester | Amount of material charged | | Reaction condition for polycondensation | $\eta sp/C$ (DMF) |
|---|---|---|---|---|
| ⑦ | Diethyl p-phenylene diacrylate | 3.84 g (14 mmol) | Ester exchange 220° C. | 0.27 |
| | Dimethyl 5-sodium sulfoisophthalate | 1.78 g (6 mmol) | Polycondensation | |
| | Rikaresin HEO-20*[1] | 1.38 g (4 mmol) | 243° C./1 mmHg × 40 min. | |

TABLE 8-continued

| Polyester | Amount of material charged | | Reaction condition for poly-condensation | ηsp/C (DMF) |
|---|---|---|---|---|
| | Triethylene glycol | 7.00 g (47 mmol) | | |
| ⑧ | Diethyl p-phenylene diacrylate | 2.74 g (10 mmol) | Ester exchange 215° C. | 0.35 |
| | Dimethyl 5-sodium sulfoisophthalate | 2.96 g (10 mmol) | Polycondensation | |
| | Rikaresin HEO-20 | 1.31 g (4 mmol) | 240° C./0.7 mmHg × 60 min. | |
| | Triethylene glycol | 7.00 g (47 mmol) | | |
| ⑨ | Diethyl p-phenylene diacrylate | 3.01 g (11 mmol) | Ester exchange 215° C. | 0.31 |
| | Dimethyl 5-sodium sulfoisophthalate | 2.66 g (9 mmol) | Polycondensation | |
| | Rikaresin HPO-40*² | 1.86 g (4 mmol) | 260° C./0.9 mmHg × 40 min. | |
| | Triethylene glycol | 7.00 g (48 mmol) | | |
| ⑩ | Diethyl p-phenylene diacrylate | 16.44 g (60 mmol) | Ester exchange 225° C. | 0.25 |
| | Dimethyl 5-sodium isophthalate | 11.84 g (40 mmol) | Polycondensation | |
| | Rikaresin HPO-40 | 23.28 g (50 mmol) | 260° C./20 mmHg × 30 min. | |
| | Triethylene glycol | 35.0 g (235 mmol) | | |

*¹Manufactured by Shin Nihon Rika Co., Ltd.: Ethylene oxide (2 molar) addition product of hydrogenated bisphenol-A
*²Manufactured by Shin Nihon Rika Co., Ltd.: Propylene oxide (4 molar) addition product of hydrogenated bisphenol-A

TABLE 9

| Example No. | 26 | 27 | 28 | 29 |
|---|---|---|---|---|
| Photosensitive liquid | (26) | (27) | (28) | (29) |
| Polyester | ⑦ | ⑧ | ⑨ | ⑩ |
| | 1.00 g | 1.00 g | 1.00 g | 1.00 g |
| Biscoat 300 | 0.40 g | 0.40 g | 0.40 g | 0.40 g |
| DBT | 0.05 g | 0.05 g | 0.05 g | 0.05 g |
| Benzil | 0.028 g | 0.028 g | 0.028 g | 0.028 g |
| Michler's ketone | 0.028 g | 0.028 g | 0.028 g | 0.028 g |
| Dioctylphthalate | 0.05 g | 0.05 g | 0.05 g | 0.05 g |
| Aizen Victoria Pure Blue BOH | 0.006 g | 0.006 g | 0.006 g | 0.006 g |
| Ethylene glycol monomethyl ether | 24.00 g | 24.00 g | 24.00 g | 24.00 g |

The chemical resistance, the abrasion resistance and the ink affinity for the imaged areas obtained by exposing and developing the printing plates (26)-(29) were measured quite in the same manner as in Example 9, and satisfactory results were obtained.

Having now fully described this invention, it will be apparent to one of ordinary skill in the art that many changes and modifications can be made thereto without departing from the spirit or scope of the invention as set forth herein.

What is claimed and intended to be covered by Letters Patent is:

1. A photosensitive lithographic plate having, on a substrate, a photosensitive layer comprising a photosensitive polyester containing at least (A):

(a) an aromatic dicarboxylic acid unit represented by the general formula:

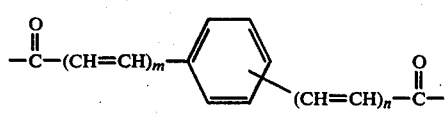
(I)

where m and n each represents an integer of 0 or 1, with at least one of them being 1,
(b) a dicarboxylic acid unit having a sulfonate group, and
(c) a diol unit represented by the general formula:

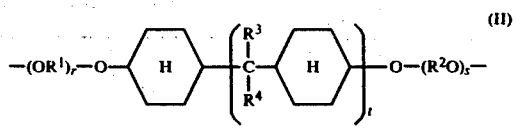
(II)

where 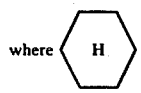 represents a hydrogenated benzene ring, R¹ and R² each represents an alkylene group of 2–4 carbon atoms, R³ and R⁴ each represents a hydrogen atom or an alkyl group of 1–6 carbon atoms, r and s each represents an integer of from 0 to 3 and t represents an integer of 0 or 1.

2. The photosensitive lithographic plate according to claim 1, wherein the photosensitive polyester (A) contains, (a) an aromatic dicarboxylic acid unit represented by the general formula (I)

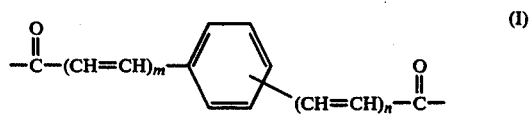
(I)

where m and n each represents an integer of 0 or 1, with at least one of them being 1,
(b) a dicarboxylic acid unit having a sulfonate group,
(c) the diol unit represented by the general formula (II)

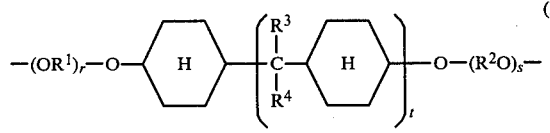

where 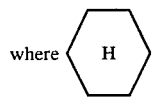 represents a hydrogenated benzene ring, $R^1$ and $R^2$ each represents an alkylene group of 2-4 carbon atoms, $R^3$ and $R^4$ each represents a hydrogen atom or an alkyl group of 1-6 carbon atoms, r and s each represents an integer of from 0 to 3 and t represents an integer of 0 or 1, and (d) an aliphatic diol unit.

3. The photosensitive lithographic plate according to claim 1 or 2 wherein the photosensitive layer further contains, (B) an ethylenically unsaturated compound having at least two terminal unsaturated double bonds enabling addition polymerization, and (C) a photopolymerization initiator.

4. The photosensitive lithographic plate according to claim 3, wherein the photopolymerization initiator (C) is a photoinitiator system.

5. The photosensitive lithographic plate according to claim 2, wherein the photosensitive layer further contains: (D) a resin containing phenolic hydroxy group.

* * * * *